United States Patent [19]

Fellows

[11] 4,309,664
[45] Jan. 5, 1982

[54] DIGITAL ENERGY LINE SENSOR

[75] Inventor: David M. Fellows, Cambridge, Mass.

[73] Assignee: GTE Laboratories Incorporated, Waltham, Mass.

[21] Appl. No.: 93,428

[22] Filed: Nov. 13, 1979

[51] Int. Cl.³ .............................................. H03K 5/00
[52] U.S. Cl. ...................................... 328/140; 307/522
[58] Field of Search .................... 307/233 R; 328/136, 328/140, 141

[56] References Cited

U.S. PATENT DOCUMENTS

| | | | |
|---|---|---|---|
| 3,138,759 | 6/1964 | Thompson | 328/140 X |
| 3,466,550 | 9/1969 | Wolf et al. | 328/140 |
| 3,997,869 | 12/1976 | Mayer | 328/140 X |

*Primary Examiner*—James B. Mullins
*Attorney, Agent, or Firm*—Fred Fisher

[57] ABSTRACT

A digital line sensor includes a voltage sensor which receives transmission of unipolar pulses. A pulse former, coupled to receive the output of the voltage sensor, is coupled to an analog integrator, which, in turn, is coupled to an energy sensor. The digtial line sensor utilizes a comparator circuit for the voltage sensor and a Schmitt trigger for the energy sensor. The analog integrator includes a resistor between the output of the pulse former and the input of the energy sensor. One electrode of a diode is coupled to the output of the pulse former, the second electrode being coupled to the input of the energy sensor. A capacitor is coupled across the input of the energy sensor and a point of reference potential. The digital line sensor can include a first Schmitt trigger adapted to receive transmission of unipolar pulses, the inverted output of which is again inverted by an inverter. An analog integrator couples the output of the inverter to a second Schmitt trigger. The analog integrator includes a resistor between the output of the inverter and the input of the second Schmitt trigger. One electrode of a diode is coupled to the output of the inverter, the second electrode being coupled to the input of the second Schmitt trigger. A capacitor is coupled across the input of the second Schmitt trigger and a point of reference potential.

2 Claims, 2 Drawing Figures

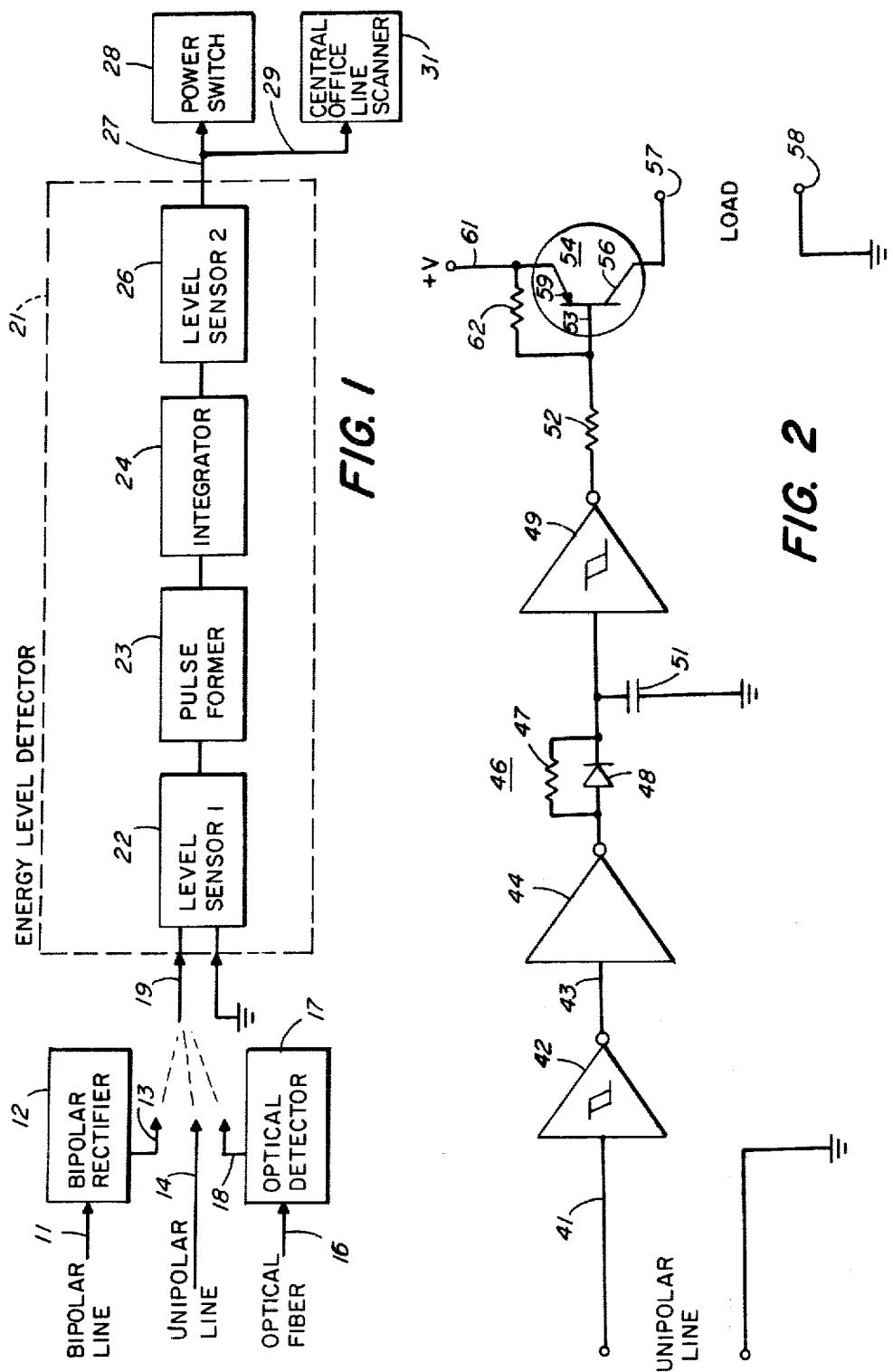

DIGITAL ENERGY LINE SENSOR

BACKGROUND OF THE INVENTION

1. Field of the Invention

This invention relates to digital line sensors, and, in particular, to digital energy line sensors which find utility in telecommunication systems. Accordingly, it is a general object of this invention to provide new and improved sensors of such character.

2. Description of the Prior Art

This invention is concerned with a communication system having an instrument at each end of a communications link. The instrument at each end is required to be advised when the other end wants it to respond. Each end, when it desires to initiate a conversation, notifies the other end that it should ring, buzz, turn itself on, or otherwise notify that the near end wants to talk. Thus, there are two goals: (1) letting the other end know that you wish to talk, and (2) when the other end wants to talk, letting you know.

In the past, in an ordinary telephone system, when the far end wanted to talk to you, a large ringing voltage was transmitted through the line, actuating and causing a clapper to move back and forth, hitting a bell. In the other direction, when you wished to talk to a central office, you picked up your handset, completing a circuit. Current begins to flow in a twisted pair loop and a dc current detector at the central office detects that some current has started to flow, initiating the system, providing a dial tone which indicates: "Yes, I have recognized your request to communicate with me, now dial".

Various U.S. patents, dealing with related technology, may be of interest.

U.S. Pat. No. 3,550,134 to Kurth et al, issued Dec. 22, 1970, discloses a double carrier bilateral transmission system which includes a transceiver at each end connected by a lossy transmission medium which introduces significant phase shift and attenuation to a modulated carrier passing therethrough. Each transceiver comprises a phase locked loop which transmits and receives modulated carriers having different carrier frequencies where the different frequencies are integral multiples of each other. One transceiver includes an auxiliary control circuit and an automatic gain control circuit to compensate for the phase shift and attenuation suffered by the modulated carrier in the transmission medium, respectively.

U.S. Pat. Nos. 3,546,703 and 3,550,131 to Kurth, issued Dec. 8 and 22, 1970, respectively, disclose frequency modulated analog systems which may be used for telephone transmission. The received analog system is converted to digital pulses and demodulated with a digital phase locked loop. The conversion is accomplished by means similar to conventional means for receiving digital signals, i.e., a level sensor (detector) followed by a pulse former (regenerator). The signal is then fed into a differentiator. Kurth detects changes in voltage on the transmission line which is proportional to line frequency which is proportional to the modulated analog signal desired. Disadvantageously, it is noted that frequency is measured in lieu of the presence of energy.

U.S. Pat. No. 3,341,815 to Axe, issued Sept. 12, 1967, discloses a receiving system with outputs to actuable means which may include a Schmitt trigger circuit. In a broad sense, Axe utilizes a detector (as above) followed by a regenerator (Schmitt trigger circuit). It is noted, however, that Axe does not suggest integration which is necessary to detect energy.

U.S. Pat. No. 4,056,694 to Brolin, issued Nov. 1, 1977, discloses a telephone ringing signal detector for detecting four party fully selective superimposed ringing signals on a telephone line. Detecting these signals at the central office end of a subscriber loop carrier system permits encoding the ringing signals for transmission on the carrier system and subsequent decoding and utilization at a remote carrier terminal to control the regeneration of selective ringing signals. The ringing detector includes separate 20 Hz alternating circuit signal detectors for each conductor of the telephone pair and further includes a separate polarity detector for each conductor. The polarity signals for the two conductors are gated by the outputs of the respective 20 Hz signals and combined in a single polarity indication applicable for either conductor. False signaling indications are thereby prevented in the presence of central office variations of amplitude, waveform and level of the dc signals, as well as variations in the phase of the ringing signals. Disadvantageously, Brolin does not suggest circuitry for use in a telephone to detect a central office request for service (ring), nor circuitry for the central office to detect a telephone request for service.

U.S. Pat. No. 4,048,448 to Canniff et al, issued Sept. 13, 1977, discloses a subscriber loop digital carrier system with a ringer encoder similar to that disclosed by Brolin, above. It also discloses a means for receiving an encoded ring signal and applying appropriate ringing voltages at the remote terminal end. Disadvantageously, Canniff et al is unduly power consuming.

U.S. Pat. No. 4,132,864 to Feng, issued Jan. 2, 1979, discloses the detection of a dc current, either alone or in the presence of a higher ac ringing current. Feng utilizes high frequency pulses to measure the duty cycle of loop current, employing digital detection circuitry. Further, Feng utilizes a high frequency master clock, and records the duration of a comparator output by summing master clock signals. Disadvantageously, a dc current as detected by Feng may no longer be present in digital telephones, and Feng's disclosed approach cannot be used in the telephone itself as a replacement for ringing voltages.

U.S. Pat. No. 3,359,372 to DeBurro, issued Dec. 19, 1967, relates to telephone signaling, and discloses a means for multiplexing two signal bits in a single digit space without creating a false framing pattern. Signaling detectors and regenerators are also disclosed. Disadvantageously, DeBurro does not suggest circuitry for use in a telephone to detect a central office request for service (ring), nor circuitry for use in the central office to detect a telephone request for service.

U.S. Pat. No. 3,336,444 to Piechocki, issued Aug. 15, 1967, discloses a telephone sensor system wherein a detector of binary signals trips a bi-stable trigger circuit (regenerator) providing a stream of pulses for both comparison purposes and for tripping a monostable trigger circuit. Disadvantageously, Piechocki does not suggest integration, and, though a Schmitt trigger is disclosed for converting sine waves into pulses, it does not have any direct bearing on detection.

In a digital telephone transmission system, in the ringing direction, large ac ringing voltages can no longer be sent, since they would tend to destroy the telephone circuitry. In the other direction, the telephone instrument that one is using may no longer be powered from the central office, so that when one goes off hook (turns on the instrument), it may no longer draw a current from the central office.

If a ringing voltage cannot be transmitted, or if a dc current is unavailable, how does one signal back and forth one's intent? An additional requirement for the system is that it be of low power so that, when the telephone handset is not in service, it consumes very little power. Preferably, it should be some kind of a sensor on the communications link because electrically conductive wire is being replaced with optical fiber; thus, no voltage and no current can be sent from one end of the link to the other.

What are the possible solutions? One solution, though complicated, would be to have a receiver continously operative that would recognize a special coded signal from the far end that it should do something (i.e., turn on a ringer, flash a light, send dial tone down, etc.). U.S. Pat. No. 3,336,444 to Piechocki describes a radio system which, when it receives the beginning of a bit stream, trips a trigger circuit which starts a shift register, compares a code stored in the shift register with the code received over the air, and at the end of the comparison, trips a ringer, a flashing light, or something else. Disadvantageously, all of the detector circuitry must be kept on, having the receiver continually distinguishing ones and zeros. Any noise spike would set off his circuit, initiating comparison of noise with its stored code, and then turning itself off because the noise would not be the internal code. Disadvantageously, it is not desired that noise initiate a call every time that some impulse noise comes down the line. It is not desired to have complex, sophisticated circuitry always being ready to turn on.

SUMMARY OF THE INVENTION

Another object of this invention is to provide for a new and improved digital line sensor that can detect any digital transmission from a digital telephone.

Still another object of this invention is to provide for a new and improved digital line sensor which can sense alternating current or digital signals as opposed to direct current signals.

Yet another object of this invention is to provide for a new and improved digital line sensor which is capable of operation with low current drain, noise immunity and simplicity of design.

In accordance with a preferred embodiment of this invention, a digital line sensor includes a voltage sensor having an input adapted to receive transmission of unipolar pulses. A pulse former has an input coupled to an output of the voltage sensor. An analog integrator has an input coupled to an output of the pulse former. An energy sensor has an input coupled to an output of the analog integrator. In accordance with certain features of the invention, the digital line sensor utilizes a comparator circuit for the voltage sensor and can utilize a Schmitt trigger for the energy sensor. In accordance with other features of the invention, the analog integrator includes a resistor having a first end coupled to the output of the pulse former and has a second end coupled to the input of the energy sensor. Further, a diode has one electrode coupled to the output of the pulse former and has a second electrode coupled to the input of the energy sensor. A capacitor has a first plate coupled to the input of the energy sensor and has a second plate coupled to a point of reference potential.

In accordance with another embodiment of the invention, a digital line sensor includes a first Schmitt trigger having an input adapted to receive transmission of unipolar pulses. An inverter is coupled to invert the inverted output of the first Schmitt trigger. An analog integrator couples an output of the inverter to an input of a second Schmitt trigger. In accordance with a certain feature of the invention, the analog integrator includes a resistor having a first end coupled to the output of the inverter and has a second end coupled to the input of the second Schmitt trigger. A diode has one electrode coupled to the output of the inverter and has a second electrode coupled to the input of the second Schmitt trigger. A capacitor has a first plate coupled to the input of the second Schmitt trigger and has a second plate coupled to a point of reference potential.

BRIEF DESCRIPTION OF THE DRAWINGS

Other objects, advantages, and features of this invention, together with its construction and mode of operation, will become more apparent from the following description, when read in conjunction with the accompanying drawings, in which:

FIG. 1 is a block diagram of one embodiment of the invention; and

FIG. 2 is a block diagram of a specific embodiment of the invention.

DESCRIPTION OF A PREFERRED EMBODIMENT(s)

One approach taken by this invention is to detect the presence of energy along an input line to a telephone set or to a central office. The presence of voltage or current along a line implies that a certain quantity of power is present. When power is integrated over a period of time, energy is provided. Referring to FIG. 1, there is shown a block diagram of a preferred embodiment of the invention in which signals can be provided by various means. The signals along a bipolar line 11 can be coupled to a bipolar rectifier 12 which provides rectified signals along an output line 13. Such signals on the line 13 are of a single polarity.

Alternatively, unipolar signals, of one polarity only, can be provided along a unipolar line 14. Or, optical signals can be provided along an optical fiber 16. The optical signals are indicated by the absence or presence of light pulses, and are detected by an appropriate optical detector 17 which provides signals therefrom along a line 18.

The unipolar signals which are present on either of the lines 13, 14 and 18 are coupled to an input line 19 of an energy level detector 21. The energy level detector 21 includes a first level sensor 22 having one input coupled to the line 19 and having a second input coupled to a point of reference potential, such as ground.

The level sensor 22 is coupled through a pulse former 23 to an integrator 24, the output of the integrator 24 being coupled to a second level sensor 26. The output of the level sensor 26, which is the output of the energy level detector 21, is provided along a line 27 so as to operate a power switch 28 in a telephone instrument (not shown) or coupled to an appropriate line 29 to a central office line scanner 31.

In accordance with another embodiment of the invention, signals can be provided along a unipolar line 41 to the input of a first Schmitt trigger 42, the output of which provides inverted signals along a line 43 to the input of an inverter 44, the output of which provides inverted signals to an integrator 46 which includes a resistor 47 and a diode 48 connected in parallel. The resistor 47 and the diode 48 are both coupled to the input of a second Schmitt trigger 49. A capacitor 51 has one plate coupled to the input of the Schmitt trigger 49 and has its other plate coupled to a point of reference potential, such as ground. The output of the Schmitt trigger 49, which inverts its input, is coupled through a first resistor 52 to a base 53 of a p-n-p transistor 54. A collector 56 of the transistor 54 is coupled to one terminal 57 of a load, whereas another terminal 58 of the load is coupled to a point of reference potential, such as ground. An emitter 59 of the transistor 54 is coupled to a voltage source +V at a terminal 61. The voltage source +V from the terminal 61 is also coupled via a resistor 62 to the base 53 of the transistor 54.

Referring again to FIG. 1, the action provided by the integrator 24 helps eliminate false tripping of the circuit due to impulse noise on the transmission line 19 by converting voltage sensing (via, the level sensor 22) into energy sensing (via, level sensor 26). The second level sensor 26, preferably, is a Schmitt trigger because of the slowly varying voltage which is provided at its input. The level sensor 22 can be a conventional comparator. The circuit of FIG. 1 detects the presence of pulses but it does not actually receive and decode the pulses; in a sense, the circuit can be termed a digital energy line sensor.

Referring to the circuit shown in FIG. 2, the digital line sensor utilizes a unipolar input at the line 41. When bipolar transmission is used, it is first converted to unipolar. The transmission line 41 is sensed by the Schmitt trigger 42. The Schmitt trigger 42 reduces input sensitivity to noise by requiring the signal to exceed a threshold before operation. The inverted output of the first Schmitt trigger 42 is then inverted by the inverter 44, integrated by the integrator 46, and applied to the second Schmitt trigger 49. When enough digital ones have appeared on the transmission line 41, the output of the second Schmitt trigger 49 goes from high to low, which output, in a central office line sensor, is the point scanned by the processor. The subsequent circuitry (including the resistors 52, 62, and the transistor 54) is for a handset sensor and not for the central processor at the central office. Such circuitry includes a power transistor 54 (which is turned on by the high to low transition) that powers the receiving logic, shown as a load.

A suitable value for the resistor 47 is one megohm; a suitable value for the capacitor 51 is 4700 pf. Such values of the integrator 46 are chosen on the basis of the format used by some digital telephones and can be different for different signaling duty cycles. Such a design assures that detection only occurs when sufficient signal is present in a preset time period such as a sampling period of 125 microseconds.

The Schmitt inverters can be CMOS type MC14584 which are contained in a single IC package. Such a circuit draws three micro-amperes while idle (sensing the line), and delivers as much current as required to the load while triggered (by selecting the proper power transistor).

In summary, a first level sensor 22 detects when there is more than a certain amount of voltage on the line, followed by an integrator 24 which integrates over a certain period of time. When a certain voltage is present over that time period, a second level sensor 26 is tripped, turning on the telephone circuitry, examining the actual code which is being sent down the line, turning on a dial tone, ringing a ringer, etc. The first level sensor 22 is of very low power, and, when a signal of a certain energy is provided on the line 19, it is received thereby. When there is a certain amount of energy present on the line, the second level sensor 26 trips, and its output can be used in a telephone instrument to activate the remainder of the circuitry in the telephone. In a central office, the output of the second level sensor 26 can be used as a digital input to a central office line scanner 31 which scans the lines in succession looking for activity.

The central office line scanner 31 can be scanning the energy line sensors. In addition, the output can be used in a central office to actuate power on the line card, such line card being where a pair of wires first enters the circuitry of the central office. The circuitry on the line card is normally powered when the energy level detector detects some activity on the line, enabling the signal to be received and proper action taken.

Such sensors, located at the individual subscriber's phone and at the central office, can be used to solve both the problems of someone wanting to call you, and you wanting to call someone.

When a far end party wishes some action by the near end party, the energy level detector detects digital energy which has been put on the transmission link by a far end terminal. This can either be a central office signaling a handset, or a handset signaling a central office. The energy is detected by a first level sensor 22 which detects pulses for activity above a certain dc threshold, followed by a pulse former 23 which forms either a zero or a one, depending on the input level. The output of the pulse former is fed into the analog integrator 24, which integrates the pulses detected by the first level sensor 22 and pulse former 23, integrates them, and when they exceed a certain energy level, trips the second level sensor 26. The output of the second level sensor 26 is a digital signal which can be used both to turn on a power switch 28, which would give power to the rest of the circuitry, and to enable the detected digital pulses to be properly received and decoded. The output of the second level sensor 26 can also be an input to a line scanner 31 or similar device for scanning subscriber lines at a central office.

The output of the pulse former 23 or inverter 44 is fed through a resistor 47 and diode 48 in parallel, to a capacitor 51 where the integration is performed, followed by a second Schmitt trigger circuit 49 in a preferred embodiment. When the voltage level at the capacitor 51 reaches a certain point, the second Schmitt trigger 49 is tripped and the output digital level is used to turn on a transistor switch 54 which switches power to the rest of the receive circuitry.

The resistor 47 which is in parallel with the diode 48 provides a means for bleeding or leaking current off of the integration capacitor 51. When there is no signal activity on the line 41, the pulse former output would be at zero and the incidental energy provided by a few noise pulses that had charged the capacitor 51 would be bled off. There continuously has to be a certain amount of energy within a certain time frame for the second Schmitt trigger 49 to remain tripped. The time frame and the amount of energy is determined by the values of the resistor 47 and the capacitor 51. The values selected match a digital telephone system utilizing a time frame of 125 microseconds and ten pulses at a 256 kilobit rate.

When the circuitry is tripped, turning on a switch 28, an input shift register (not shown) is powered so that the pulses on the line are now fed into a shift register and an internal clock is powered to clock these signals into the shift register. The code is then compared with a ringing or test code, and if it is a ringing signal, a ringer is turned on and pulses are started. Pulses are sent back to the central office, representing "Yes, I have powered myself up, I am now ringing, and the conversation may ensue".

The power switch 28 turns off when the central office either instructs the phone to shut off or drops off completely, in which case there is no longer enough energy.

Other modifications may be performed without departing from the spirit and scope of the invention which modifications will be apparent to those ordinarily skilled in the art.

What is claimed is:

1. A digital line sensor comprising:
   a first Schmitt trigger having an input adapted to receive transmission of unipolar pulses, and adapted to provide an inverted output therefrom;
   an inverter coupled to invert said inverted output of said first Schmitt trigger;
   a second Schmitt trigger having an input and an output; and
   an analog integrator for coupling the output of said inverter to the input of said second Schmitt trigger.

2. The digital line sensor as recited in claim 1 wherein said analog integrator comprises:
   a resistor having a first end coupled to said output of said inverter, and having a second end coupled to said input of said second Schmitt trigger;
   a diode having one electrode coupled to said output of said inverter, and having a second electrode coupled to said input of said second Schmitt trigger; and
   a capacitor having a first plate coupled to said input of said second Schmitt trigger, and having a second plate coupled to a point of reference potential.

* * * * *